United States Patent

Yang

(10) Patent No.: US 10,505,521 B2
(45) Date of Patent: Dec. 10, 2019

(54) HIGH VOLTAGE DRIVER CAPABLE OF PREVENTING HIGH VOLTAGE STRESS ON TRANSISTORS

(71) Applicant: eMemory Technology Inc., Hsin-Chu (TW)

(72) Inventor: Cheng-Te Yang, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 5 days.

(21) Appl. No.: 16/045,692

(22) Filed: Jul. 25, 2018

(65) Prior Publication Data

US 2019/0214975 A1    Jul. 11, 2019

Related U.S. Application Data

(60) Provisional application No. 62/615,463, filed on Jan. 10, 2018.

(51) Int. Cl.
| | |
|---|---|
| *H03K 3/26* | (2006.01) |
| *H03K 3/356* | (2006.01) |
| *H02M 3/07* | (2006.01) |

(52) U.S. Cl.
CPC ........ *H03K 3/356113* (2013.01); *H02M 3/07* (2013.01)

(58) Field of Classification Search
CPC ............ H03K 3/26; H03K 5/13; H03K 5/131; H03K 5/133; H03K 5/134
See application file for complete search history.

(56) References Cited

U.S. PATENT DOCUMENTS

| | | | |
|---|---|---|---|
| 4,752,699 A | 6/1988 | Cranford, Jr. | |
| 7,348,809 B2 * | 3/2008 | Eldredge | H03F 3/45183 326/83 |
| 7,759,987 B2 * | 7/2010 | Hishikawa | H03K 3/35613 327/112 |
| 8,823,425 B2 * | 9/2014 | Heo | H03K 17/08122 327/108 |
| 9,231,590 B1 | 1/2016 | Schie | |
| 9,627,963 B2 | 4/2017 | Takeshita | |

FOREIGN PATENT DOCUMENTS

| | | |
|---|---|---|
| CN | 103929057 A | 7/2014 |
| CN | 104348472 A | 2/2015 |
| TW | 200641898 | 12/2006 |
| TW | 200822134 | 5/2008 |

* cited by examiner

*Primary Examiner* — Hai L Nguyen
(74) *Attorney, Agent, or Firm* — Winston Hsu

(57) ABSTRACT

A high voltage driver includes a charge pump, a level shift circuit, a first string of diodes, and a second string of diodes. The charge pump adjusts a driving voltage according to a feedback voltage. The level shift circuit generates an output voltage according to the at least one control signal, and the level shift circuit includes a plurality of stacked transistors for relieving a high voltage stress caused by the driving voltage, and a plurality of control transistors coupled to the plurality of stacked transistors for controlling the output voltage. The first string of diodes provides a plurality of divisional voltages between the driving voltage and a reference voltage, and each of the stacked transistors has a control terminal receiving a corresponding divisional voltage of the plurality of divisional voltages. The second string of diodes provides the feedback voltage.

12 Claims, 2 Drawing Sheets

HIGH VOLTAGE DRIVER CAPABLE OF PREVENTING HIGH VOLTAGE STRESS ON TRANSISTORS

CROSS REFERENCE TO RELATED APPLICATIONS

This non-provisional application claims priority of U.S. provisional application No. 62/615,463, filed on Jan. 10, 2018, included herein by reference in its entirety.

BACKGROUND OF THE INVENTION

1. Field of the Invention

The present invention is related to a high voltage driver, and more particularly, to a high voltage driver capable of preventing high voltage stress on transistors.

2. Description of the Prior Art

Due to requirements of low power for electronic devices, the power specification of integrated circuits (IC) is redesigned to work in a low voltage environment for reducing power consumption. For example, the IC power specification that used to be 5V before is now reduced to 3.3V or even lower than 2V. Although lower voltages are supplied to reduce power consumption, greater voltages are still needed in some situations. For example, flash memory may require a greater voltage for programming or erasing. The greater voltage is usually supplied by a charge pump.

To control such high voltage with elements manufactured in a low voltage process, stacked transistors controlled by intermediate voltages are usually applied in prior art. However, just like the output voltage of the charge pump, the circuit used to provide the intermediate voltages also needs time to reach the desired levels. Before the intermediate voltages reach their target levels and become stable, the voltage stress applied on the stacked transistors can still damage the transistors. Furthermore, if the intermediate voltages are raised in a slower pace than the output voltage of the charge pump, then the output voltage of the charge pump would become overshot due to the late feedback scheme.

SUMMARY OF THE INVENTION

One embodiment of the present invention discloses a high voltage driver. The high voltage driver includes a charge pump, a level shift circuit, a first string of diodes, and a second string of diodes.

The charge pump has an output terminal for outputting a driving voltage, and a feedback terminal for receiving a feedback voltage. The charge pump adjusts the driving voltage according to the feedback voltage. The level shift circuit is coupled to the output terminal of the charge pump and a system voltage terminal. The level shift circuit receives at least one control signal and generates an output voltage according to the at least one control signal. The level shift circuit includes a plurality of stacked transistors for relieving a high voltage stress caused by the driving voltage, and a plurality of control transistors coupled to the plurality of stacked transistors for controlling the output voltage.

The first string of diodes is coupled in series between the output terminal of the charge pump and the system voltage terminal, and provides a plurality of divisional voltages between the driving voltage and a reference voltage provided by the system voltage terminal. Each of the plurality of stacked transistors has a control terminal for receiving a corresponding divisional voltage of the plurality of divisional voltages. The second string of diodes is coupled in series between the output terminal of the charge pump and the system voltage terminal, and provides the feedback voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
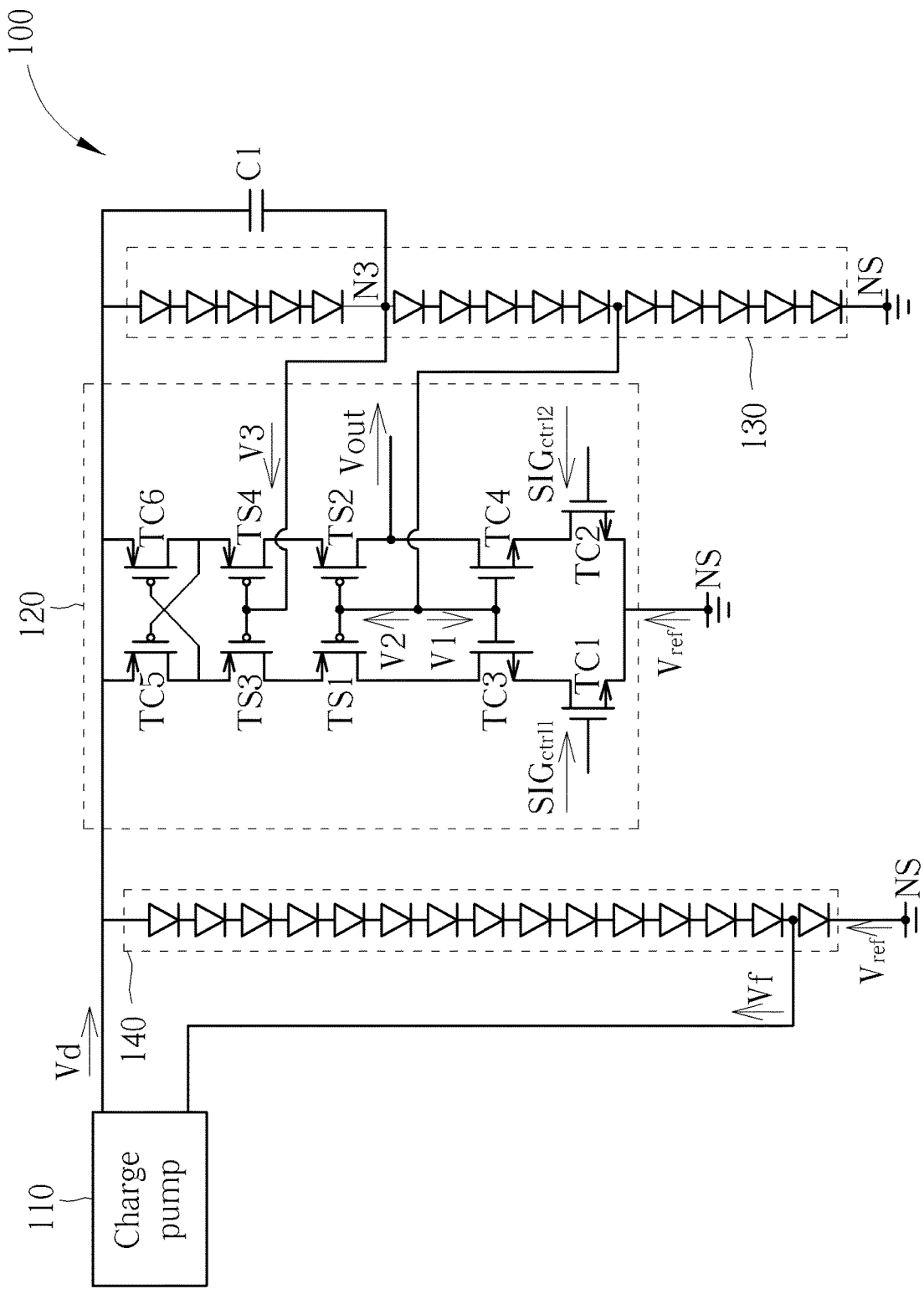
FIG. 1 shows a high voltage driver according to one embodiment of the present invention.

FIG. 1 shows a high voltage driver 100 according to one embodiment of the present invention. The high voltage driver 100 includes a charge pump 110, a level shift circuit 120, a first string of diodes 130, and a second string of diodes 140.

The charge pump 110 has an output terminal for outputting a driving voltage Vd, and a feedback terminal for receiving a feedback voltage Vf. The charge pump 110 can generate the high driving voltage Vd required by the system by pumping a lower system operation voltage. For example, the charge pump 110 may generate the driving voltage Vd at 18V by starting with a system operation voltage at 3.3V. Furthermore, to ensure the driving voltage Vd can reach the desired level and become stable, the charge pump 110 can also adjust the driving voltage Vd according to the feedback voltage Vf.

The level shift circuit 120 is coupled to the output terminal of the charge pump 110 and a system voltage terminal NS. In some embodiments, the system voltage terminal NS can provide a reference voltage Vref, and the reference voltage Vref can be the ground voltage of the system. The level shift circuit 120 can receive the first control signal $SIG_{ctrl1}$ and the second control signal $SIG_{crtl2}$, and generate an output voltage Vout according to the control signals $SIG_{ctrl1}$ and $SIG_{ctrl2}$. That is, the level shift circuit 120 can be used to control whether to output the high driving voltage Vd as the output voltage Vout or not according to the control signals $SIG_{ctrl1}$ and $SIG_{ctrl2}$.

The level shift circuit 120 includes a plurality of stacked transistors TS1 to TS4 and a plurality of control transistors TC1 to TC6. The plurality of stacked transistors TS1 to TS4 can relieve the high voltage stress caused by the driving voltage Vd. The plurality of control transistors TC1 to TC6 can be coupled to the plurality of stacked transistors TS1 to TS4 and control the output voltage Vout.

In FIG. 1, the first control transistor TC1 has a first terminal, a second terminal, and a control terminal. The second terminal of the first control transistor TC1 is coupled to the system voltage terminal NS, and the control terminal of the first control transistor TC1 can receive the first control signal $SIG_{ctrl1}$. The second control transistor TC2 has a first terminal, a second terminal, and a control terminal. The second terminal of the second control transistor TC2 is coupled to the system voltage terminal NS, and the control terminal of the second control transistor TC2 can receive the second control signal $SIG_{ctrl2}$ complementary to the first control signal $SIG_{ctrl1}$. In some embodiments, since the second control signal $SIG_{ctrl2}$ is complementary to the first control signal $SIG_{ctrl1}$, the level shift circuit 120 may receive one of the control signals $SIG_{ctrl1}$ or $SIG_{crtl2}$, and generate the other control signal with an inverter.

The third control transistor TC3 has a first terminal, a second terminal, and a control terminal. The first terminal of the third control transistor TC3 is coupled to the plurality of stacked transistors TS1 to TS4, the second terminal of the third control transistor TC3 is coupled to the first terminal of the first control transistor TC1, and the control terminal of the third control transistor TC3 can receive a first divisional voltage V1. The fourth control transistor TC4 has a first terminal, a second terminal, and a control terminal. The first terminal of the fourth control transistor TC4 is coupled to the plurality of stacked transistors TS1 to TS4, the second terminal of the fourth control transistor TC4 is coupled to the first terminal of the second control transistor TC2, and the control terminal of the fourth control transistor TC4 can receive the first divisional voltage V1.

The fifth control transistor TC5 has a first terminal, a second terminal, and a control terminal. The first terminal of the fifth control transistor TC5 is coupled to the output terminal of the charge pump 110, and the second terminal of the fifth control transistor TC5 is coupled to the plurality of stacked transistors TS1 to TS4. The sixth control transistor TC6 has a first terminal, a second terminal, and a control terminal. The first terminal of the sixth control transistor TC6 is coupled to the output terminal of the charge pump 110, the second terminal of the sixth control transistor TC6 is coupled to the control terminal of the fifth control transistor TC5 and the plurality of stacked transistors TS1 to TS4, and the control terminal of the sixth control transistor TC6 is coupled to the second terminal of the fifth transistor TC5.

In addition, the first stacked transistor TS1 has a first terminal, a second terminal, and a control terminal. The second terminal of the first stacked transistor TS1 is coupled to the first terminal of the third control transistor TC3, and the control terminal of the first stacked transistor TS1 can receive a second divisional voltage V2. The second stacked transistor TS2 has a first terminal, a second terminal, and a control terminal. The second terminal of the second stacked transistor TS2 is coupled to the first terminal of the fourth control transistor TC4, and the control terminal of the second stacked transistor TS2 can receive the second divisional voltage V2.

The third stacked transistor TS3 has a first terminal, a second terminal, and a control terminal. The first terminal of the third stacked transistor TS3 is coupled to the second terminal of the fifth control transistor TC5, a second terminal of the third stacked transistor TS3 is coupled to the first terminal of the first stacked transistor TS1, and the control terminal of the third stacked transistor TS3 can receive a third divisional voltage V3. The fourth stacked transistor TS4 has a first terminal, a second terminal, and a control terminal. The first terminal of the fourth stacked transistor TS4 is coupled to the second terminal of the sixth control transistor TC6, the second terminal of the fourth stacked transistor TS4 is coupled to the first terminal of the second stacked transistor TS2, and the control terminal of the fourth stacked transistor can receive the third divisional voltage V3.

In this case, when the first control signal $SIG_{ctrl1}$ is at a high voltage and the second control signal $SIG_{ctrl2}$ is at a low voltage, the level shift circuit 120 can output the driving voltage Vd as the output voltage Vout through the first terminal of the fourth control transistor TC4. Also, when the first control signal $SIG_{ctrl1}$ is at a low voltage and the second control signal $SIG_{ctrl2}$ is at a high voltage, the level shift circuit 120 can output the reference voltage Vref as the output voltage Vout through the first terminal of the fourth control transistor TC4. That is, with the level shift circuit 120, the output voltage Vout can be controlled by the first control signal $SIG_{ctrl1}$ and the second control signal $SIG_{ctrl2}$, ensuring the function circuit coupled to the high voltage driver 100 can receive the desired high voltage in time.

Furthermore, the divisional voltages V1 to V3 received by the control terminals of the stacked transistors TS1 to TS4 and the control terminals of the third and fourth control transistors tC3 and TC4 can be provided by the first string of diodes 130. The first string of diodes 130 is coupled in series between the output terminal of the charge pump 110 and the system voltage terminal NS. With the bias voltages of the diodes, the first string of diodes 130 can provide the divisional voltages V1 to V3 between the driving voltage Vd and the reference voltage Vref. In the present embodiment, the driving voltage Vd is higher than the third divisional voltage V3, the third divisional voltage V3 is higher than the second divisional voltage V2, and the second divisional voltage V2 is higher than or substantially equal to the first divisional voltage V1. For example, but not limited to, in FIG. 1, the first string of diodes 130 has a total of 15 diodes, and each of the diodes would provide a bias voltage of 1.2V. In this case, the driving voltage Vd can be 18V, the third divisional voltage V3 can be 12V, and the second divisional voltage V2 and the first divisional voltage V1 can both be 6V. Consequently, the cross voltages applied to the stacked transistors TS1 to TS4 can be reduced, preventing the stacked transistors TS1 to TS4 from being damaged by high voltage stress.

Since the first string of diodes 130 is used to provide the divisional voltages V1 to V3 for the level shift circuit 120, the divisional voltages V1 to V3 may have smaller raising speeds than the driving voltage Vd due to the charges consumed by the gate capacitors of the transistors in the level shift circuit 120. Therefore, if the feedback voltage is provided by the first string of diodes 130, the charge pump 110 may have a late response and cause the driving voltage Vd to overshoot. To address this issue, the second string of diodes 140 can be used to provide the feedback voltage Vf.

The second string of diodes 140 is coupled in series between the output terminal of the charge pump 110 and the system voltage terminal NS. Also, to ensure the feedback voltage Vf can simulate the ideal behavior of the first string of diodes 130, the first string of diodes 130 and the second string of diodes 140 can have the same number of diodes in some embodiments. Since the second string of diodes 140 does not provide the divisional voltages for other circuits, the raising speed of the feedback voltage Vf can be quite similar to the raising speed of the driving voltage Vd. Therefore, the charging pump 110 can adjust the driving voltage Vd more properly and instantly, preventing the issue of overshoot and the transistors from being damaged by overly high cross voltages caused by the overshoot.

In addition, in FIG. 1, the first stacked transistor TS1, the second stacked transistor TS2, the third stacked transistor TS3, and the fourth stacked transistor TS4 can be P-type transistors. In this case, to further enhance the durability against the voltage stress, the wells of the stacked transistors TS1 to TS4 can be coupled to the source terminals the stacked transistors TS1 to TS4. Therefore, the breakdown voltages the stacked transistors TS1 to TS4 can be increased, and the durability of the level shift circuit 120 can be enhanced.

That is, the body terminal of the first stacked transistor TS1 can be coupled to the first terminal of the first stacked transistor TS1, the body terminal of the second stacked transistor TS2 can be coupled to the first terminal of the second stacked transistor TS2, the body terminal of the third stacked transistor TS3 can be coupled to the first terminal of the third stacked transistor TS3, and the body terminal of the fourth stacked transistor TS4 can be coupled to the first terminal of the fourth stacked transistor TS4.

Similarly in FIG. 1, the first control transistor TC1, the second control transistor TC2, the third control transistor TC3, and the fourth control transistor TC4 can be N-type transistors. Also, the fifth control transistor TC5 and the sixth control transistor TC6 can be P-type transistors. In this case, the body terminal of the first control transistor TC1 can be coupled to the second terminal of the first control transistor TC1, the body terminal of the second control transistor TC2 can be coupled to the second terminal of the second control transistor TC2, the body terminal of the third control transistor TC3 can be coupled to the second terminal of the third control transistor TC3, and the body terminal of the fourth control transistor TC4 can be coupled to the second terminal of the fourth control transistor TC4. Also, the body terminal of the fifth control transistor TC5 can be coupled to the first terminal of the fifth control transistor TC5, and the body terminal of the sixth control transistor TC6 can be coupled to the first terminal of the sixth control transistor TC6.

In FIG. 1, although the level shift circuit 120 includes 4 stacked transistors TS1 to TS4, this is not to limit the scope of the present invention. In some other embodiments, if the desired driving voltage is even higher, the level shift may include even more stacked transistors with their terminals receiving the corresponding divisional voltages to relieve the great voltage stress caused by the driving voltage Vd.

In addition, if the raising speeds of the divisional voltages V1 to V3 are much smaller than the raising speed of the output voltage Vout, then the great voltage stress may still occur on the gates of the stacked transistors TS1 to TS4. In this case, a comparator may be adopted to detect and address this issue.

Figure 2:
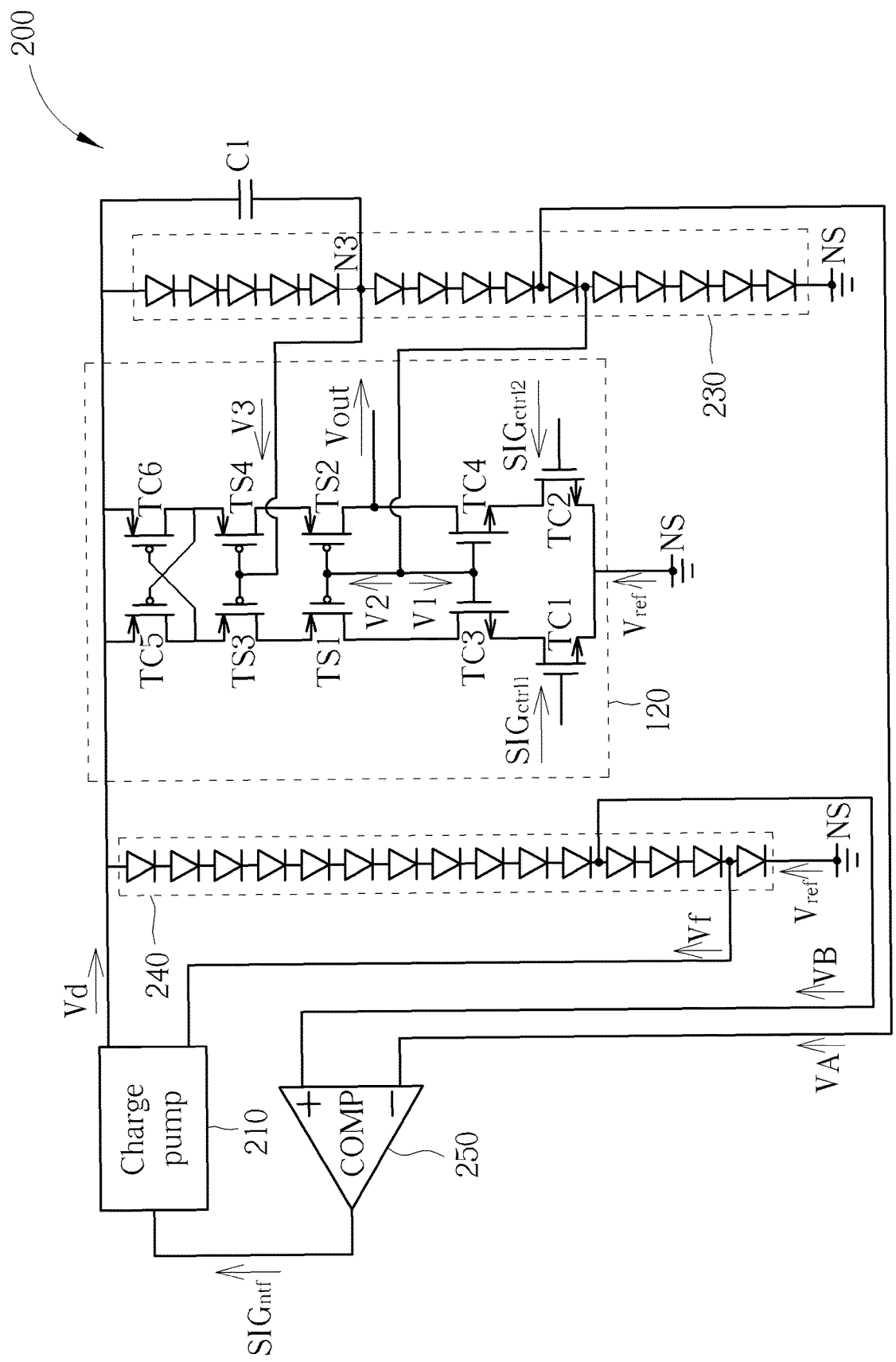
FIG. 2 shows a high voltage driver according to another embodiment of the present invention.

FIG. 2 shows a high voltage driver 200 according to another embodiment of the present invention. The high voltage drivers 100 and 200 have similar structures, and can be operated with similar principles. However, the high voltage driver 200 further includes a comparator 250. The comparator 250 can output a notification signal $SIG_{ntf}$ by comparing a first reference voltage VA provided by the first string of diodes 230 and a second reference voltage VB provided by the second string of diodes 240.

In FIG. 2, the first string of diodes 230 and the second string of diodes 240 may both have 15 diodes, the first string of diodes 230 may provide the first reference voltage VA by its sixth diode, and the second string of diodes 240 may provide the second reference voltage VB by its fourth diode. That is, during a stable status of the high voltage driver 200, the first reference voltage VA would be higher than the second reference voltage VB.

However, before the high voltage driver 200 enters the stable status, the first reference voltage VA may be lower than the second reference voltage VB due to the smaller raising speed of the first string of diodes 230. When the first reference voltage VA is lower than the second reference voltage VB, it means that the divisional voltages V1 to V3 provided by the first string of diodes 230 have largely fallen behind their desired levels, and the high voltage stress may occur on the transistors of the level shift circuit 120. Therefore, the comparator 250 can output the notification signal $SIG_{ntf}$ to the charge pump 210, and the charge pump 210 can adjust the driving voltage Vd according to the notification signal $SIG_{ntf}$.

For example, when the first reference voltage VA is lower than the second reference voltage VB, the comparator 250 can output the notification signal $SIG_{ntf}$ to the charge pump 210 to decrease a frequency of a pump clock of the charge pump 210 or to stop the charge pump 210 for a period of time. Therefore, the driving voltage Vd will slow down its raising speed or stop raising while the divisional voltages V1 to V3 provided by the first string of diodes 230 keeps raising to their target levels. Consequently, the divisional voltages V1 to V3 will not significantly fall behind their target levels, keeping the voltage stress on the stacked transistors TS1 to TS4 within an acceptable range.

Furthermore, in FIG. 2, the high voltage driver 200 further includes a capacitor C1 coupled between the output terminal of the charge pump 210 and the node N3 of the first string of diodes 230 to provide the third divisional voltage V3. With the capacitor C1, the voltage at the node N3 can be raised even faster, preventing the high voltage stress on the stacked transistors TS3 and TS4 caused by the small raising speed of the third divisional voltage V3. In some embodiments, the capacitor C1 can also be coupled to other nodes of the first string of diodes 230 according to the system requirement to raise the corresponding divisional voltage faster.

Furthermore, in some embodiments, if the system permits, the high voltage driver 200 can even use capacitor C1 to raise the divisional voltages without using the second string of diodes 240.

In summary, the high voltage driver provided by the embodiments of the present invention can generate a more responsive feedback voltage with respect to the driving voltage so the issue of overshoot can be solved. In addition, by comparing the two reference voltages provided by the two strings of diodes, the high voltage driver is able to detect the slow raising of the divisional voltages, and adjust the driving voltage accordingly to prevent the transistors from being damaged by the high voltage stress.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A high voltage driver comprising:
   a charge pump having an output terminal configured to output a driving voltage, and a feedback terminal configured to receive a feedback voltage, the charge pump being configured to adjust the driving voltage according to the feedback voltage;
   a level shift circuit coupled to the output terminal of the charge pump and a system voltage terminal, and configured to receive at least one control signal and generate an output voltage according to the at least one control signal, the level shift circuit comprising:
      a plurality of stacked transistors configured to relieve a high voltage stress caused by the driving voltage; and a plurality of control transistors coupled to the plurality of stacked transistors and configured to control the output voltage;

a first string of diodes coupled in series between the output terminal of the charge pump and the system voltage terminal, and configured to provide a plurality of divisional voltages between the driving voltage and a reference voltage provided by the system voltage terminal, wherein each of the plurality of stacked transistors has a control terminal configured to receive a corresponding divisional voltage of the plurality of divisional voltages; and a second string of diodes coupled in series between the output terminal of the charge pump and the system voltage terminal, and configured to provide the feedback voltage.

2. The high voltage driver of claim 1, wherein the first string of diodes and the second string of diodes have same number of diodes.

3. The high voltage driver of claim 1, wherein the plurality of control transistors comprises:

a first control transistor having a first terminal, a second terminal coupled to the system voltage terminal, and a control terminal configured to receive a first control signal;

a second control transistor having a first terminal, a second terminal coupled to the system voltage terminal, and a control terminal configured to receive a second control signal complementary to the first control signal;

a third control transistor having a first terminal coupled to the plurality of stacked transistors, a second terminal coupled to the first terminal of the first control transistor, and a control terminal configured to receive a first divisional voltage of the plurality of divisional voltages;

a fourth control transistor having a first terminal coupled to the plurality of stacked transistors, a second terminal coupled to the first terminal of the second control transistor, and a control terminal configured to receive the first divisional voltage;

a fifth control transistor having a first terminal coupled to the output terminal of the charge pump, a second terminal coupled to the plurality of stacked transistors, and a control terminal; and a sixth control transistor having a first terminal coupled to the output terminal of the charge pump, a second terminal coupled to the control terminal of the fifth control transistor and the plurality of stacked transistors, and a control terminal coupled to the second terminal of the fifth transistor.

4. The high voltage driver of claim 3, wherein the plurality of stacked transistors comprises:

a first stacked transistor having a first terminal, a second terminal coupled to the first terminal of the third control transistor, and a control terminal configured to receive a second divisional voltage of the plurality of divisional voltages;

a second stacked transistor having a first terminal, a second terminal coupled to the first terminal of the fourth control transistor, and a control terminal configured to receive the second divisional voltage;

a third stacked transistor having a first terminal coupled to the second terminal of the fifth control transistor, a second terminal coupled to the first terminal of the first stacked transistor, and a control terminal configured to receive a third divisional voltage of the plurality of divisional voltages; and a fourth stacked transistor having a first terminal coupled to the second terminal of the sixth control transistor, a second terminal coupled to the first terminal of the second stacked transistor, and a control terminal configured to receive the third divisional voltage.

5. The high voltage driver of claim 4, wherein the driving voltage is higher than the third divisional voltage, the third divisional voltage is higher than the second divisional voltage, and the second divisional voltage is higher than or substantially equal to the first divisional voltage.

6. The high voltage driver of claim 4, wherein:

the first stacked transistor, the second stacked transistor, the third stacked transistor, and the fourth stacked transistor are P-type transistors;

a body terminal of the first stacked transistor is coupled to the first terminal of the first stacked transistor;

a body terminal of the second stacked transistor is coupled to the first terminal of the second stacked transistor;

a body terminal of the third stacked transistor is coupled to the first terminal of the third stacked transistor; and a body terminal of the fourth stacked transistor is coupled to the first terminal of the fourth stacked transistor.

7. The high voltage driver of claim 6, wherein:

the first control transistor, the second control transistor, the third control transistor, and the fourth control transistor are N-type transistors;

the fifth control transistor and the sixth control transistor are P-type transistors;

a body terminal of the first control transistor is coupled to the second terminal of the first control transistor;

a body terminal of the second control transistor is coupled to the second terminal of the second control transistor;

a body terminal of the third control transistor is coupled to the second terminal of the third control transistor;

a body terminal of the fourth control transistor is coupled to the second terminal of the fourth control transistor;

a body terminal of the fifth control transistor is coupled to the first terminal of the fifth control transistor; and a body terminal of the sixth control transistor is coupled to the first terminal of the sixth control transistor.

8. The high voltage driver of claim 1, further comprising:

a comparator configured to output a notification signal by comparing a first reference voltage provided by the first string of diodes and a second reference voltage provided by the second string of diodes;

wherein the charge pump is further configured to adjust the driving voltage according to the notification signal.

9. The high voltage driver of claim 8, wherein during a stable status of the high voltage driver, the first reference voltage is higher than the second reference voltage.

10. The high voltage driver of claim 9, wherein before the high voltage driver enters the stable status, when the first reference voltage is lower than the second reference voltage, the comparator outputs the notification signal to the charge pump to decrease a frequency of a pump clock of the charge pump.

11. The high voltage driver of claim 9, wherein before the high voltage driver enters the stable status, when the first reference voltage is lower than the second reference voltage, the comparator outputs the notification signal to the charge pump to stop the charge pump.

12. The high voltage driver of claim 1, further comprising a capacitor coupled between the output terminal of the charge pump and a node of the first string of diodes providing a divisional voltage of the plurality of divisional voltages.

* * * * *